United States Patent [19]
Bert et al.

[11] Patent Number: 4,567,449
[45] Date of Patent: Jan. 28, 1986

[54] LOW NOISE OSCILLATOR OPERATING IN THE ULTRA-HIGH FREQUENCY RANGE

[75] Inventors: Alain Bert; Marc Camiade, both of Paris, France

[73] Assignee: Thomson-CSF, Paris, France

[21] Appl. No.: 508,914

[22] Filed: Jun. 29, 1983

[30] Foreign Application Priority Data

Jul. 2, 1982 [FR] France ............................ 82 11659

[51] Int. Cl.$^4$ ............................................. H03B 7/12
[52] U.S. Cl. ........................................ 331/56; 331/96; 331/107 P; 331/117 D
[58] Field of Search ........... 331/56, 96, 107 R, 107 P, 331/107 SL, 108 R, 117 D

[56] References Cited

U.S. PATENT DOCUMENTS

| | | | |
|---|---|---|---|
| 3,444,480 | 5/1969 | Tykulsky et al. | 331/96 |
| 3,662,285 | 5/1972 | Rucker | 331/107 R |
| 4,149,126 | 4/1979 | Archambault et al. | 331/56 |

FOREIGN PATENT DOCUMENTS

0013174 9/1980 European Pat. Off. .
2376554 7/1978 France .

OTHER PUBLICATIONS

1981 IEEE MTT-S International Microwave Symposium Digest, (New York, US) U. Komatsu et al.: "A Frequency-Stabilized MIC-Oscillator Using a Newly-Developed Dielectric Resonator", pp. 313–315.

IEEE Transactions on MTT, vol. 29, Dec. 1981, No. 12 (New York, US) R. R. Bonetti et al.: "Analysis of Microstrip Circuits Coupled to Dielectric Resonators", pp. 1333–1337, FIGS. 1–5; p. 1334: II Geometry Under Analysis and Basic Assumptions.

*Primary Examiner*—Eugene R. LaRoche
*Assistant Examiner*—Robert J. Pascal
*Attorney, Agent, or Firm*—Oblon, Fisher, Spivak, McClelland & Maier

[57] ABSTRACT

The invention relates to an ultra-high frequency oscillator (11–14 GHz) having a plurality of transistors, stabilized on at least one of their electrodes by a microstrip line coupled to a dielectric resonator. The oscillator according to the invention groups the transistors on the periphery of an insulating substrate, which centrally supports a single dielectric resonator common to all the transistors. The microstrip lines have two end portions, which are not coupled and are parallel to the field lines of the resonator, and a coupled central portion, perpendicular to the field lines. The transistors and microstrip lines are coplanar. The output is by a coaxial cable at the center of the substrate or by a microstrip line coplanar to the substrate.

11 Claims, 7 Drawing Figures

LOW NOISE OSCILLATOR OPERATING IN THE ULTRA-HIGH FREQUENCY RANGE

BACKGROUND OF THE INVENTION

The present invention relates to a low noise oscillator operating in the ultra-high frequency range, and organised around a plurality of transistors stabilized by a single dielectric resonator.

The invention relates to the field in which transistors operate in conjunction with microstrips and dielectric resonators. It is applicable to relatively low frequencies, such as 1 or 2 GHz, with bipolar transistors. However, it is of particular interest in connection with field effect transistors and at higher frequencies, such as e.g. 11 to 14 GHz.

The use of dielectric resonators, i.e. pellets of high value dielectric material, for stabilizing transistorized oscillators is well known, as is the interest in such a stabilization. Such devices permit thermal stability levels controlled by the choice of the characteristics of the resonator material, and the noise characteristics close to the carrier wave and particularly low, due to the low dielectric losses of the materials used for this purpose. This type of oscillator stabilization makes it possible to obtain a pure frequency by direct generation, without using a frequency multiplier chain.

However, in certain applications, it is necessary to have a source which, at the considered frequency, has a power higher than the power made available by a single transistor. For the same applications, it is often necessary for the power to be very stable and for the oscillator only to have a low background noise around the generated frequency.

A first known solution consists of the parallel connection of a plurality of oscillators, each having at least one transistor and a stabilizer by dielectric resonator. However, in this case it is virtually impossible to obtain resonators having in each case the same noise level and which are all identically coupled with the oscillator. This is a reason why a circuit making it possible to couple several oscillators to the same resonator is of interest, because it makes it possible to couple the transmitted power without adding the noise. However, even though the power level is not the main objective sought, the increase in the number of active elements coupled to the same resonator is of interest in connection with the noise of the oscillator close to the carrier. The first reason is linked with an increase in the coefficient $Q_{ext}$, which is the ratio between the energy stored in cycles in the resonator and the power supplied to the load. With a given output power, it is possible to couple more energy in the single resonator. A second reason is that the ultra-high frequency signals from the different transistors are summated in phase, whereas the noise levels are summated in an uncorrelated manner, i.e. the signal-to-noise ratio of the device improves.

SUMMARY OF THE INVENTION

The low noise oscillator according to the invention combines a plurality of transistor chips mounted in the same box and grouped around an insulating substrate, which carries the microstrips associated with the transistor chips. The single dielectric resonator is located on the central part of the insulating substrate and the microstrips are in part perpendicular and in part parallel to the magnetic field of the resonator, in such a way that only the length of each of these microstrips perpendicular to the field of the resonator is coupled therewith, the parallel parts not being influenced.

More specifically, the present invention relates to a low noise oscillator, operating in the ultra-high frequency range, comprising a plurality of transistors stabilized by a dielectric resonator coupled to a tuned microstrip line, wherein the plurality of transistors is grouped on the periphery of an insulating substrate plate, which supports a single dielectric resonator, centered on the insulating substrate and of smaller size than the latter, and wherein each transistor is connected to at least one microstrip line supported by the substrate, said line having a broken U-configuration, such that the two end portions of the microstrip line are parallel to the field lines of the resonator and the central portion, covered by the resonator and perpendicular to its field lines, is coupled to the resonator.

BRIEF DESCRIPTION OF THE DRAWINGS

The invention is described in greater detail hereinafter relative to non-limitative embodiments and with reference to the attached drawings, wherein show.

DESCRIPTION OF THE PREFERRED EMBODIMENT

Figure 1:
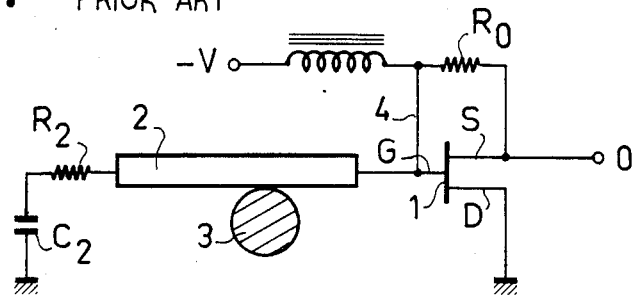
FIG. 1 an electrical diagram of a transistor stabilized by a dielectric resonator according to the prior art.

FIG. 1 is the circuit diagram of a transistor stabilized by a dielectric resonator in a configuration giving particularly interesting results. This diagram is known. The transistor shown is of the field effect type but, as has been stated, the invention also applies to bipolar transistors for lower frequencies.

The field effect transistor 1, whose source, gate and drain are respectively designated S, G and D, is connected in common drain manner, which makes it potentially unstable, so that it can oscillate in a relatively large frequency range. Gate G is connected to a microstrip line 2, to which is coupled a dielectric resonator 3. At its resonant frequency, the dielectric resonator 3 introduces into the gate line a very high impedance in the coupling plane and the oscillation conditions can thus appear for appropriate positions of resonator 3 along the microstrip line.

The oscillator is supplied from a negative voltage $-V$ on its gate by a direct connection 4 and on its source across a resistor RO. The impedance represented on its supply terminal indicates that the supply is of a high impedance type. In a similar version, the negative voltage can be applied solely to source S, the electrical connection 4 on the gate being eliminated and gate G is fixed at an appropriate potential by self-biasing. Moreover, a resistor R2 and a capacitor C2 symbolize the connection between the gate microstrip 2 and the electrical earth.

Figure 2:
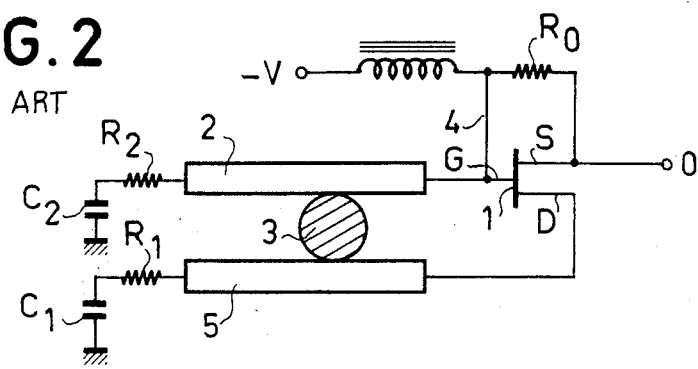
FIG. 2 a variant of the above diagram.

FIG. 2 shows a variant of the aforementioned circuit, the same references being used for designating the same objects in order to facilitate understanding.

The variant is based on the fact that drain D, instead of being connected to the system earth, is connected to a second microstrip line 5, coupled to the same dielectric resonator 3 as the first microstrip line 2 of gate G. Thus, at resonant frequency, and if its position relative to the drain is appropriately adjusted, dielectric resonator 3 causes a selective short-circuit at the drain, bringing about the same oscillating conditions as in FIG. 1, but in a more selective manner. Thus, the oscillator is better stabilized. In the same way, a resistor R1 and a capacitor C1 diagrammatically indicate the connection between the second drain microstrip 5 and the device earth.

In the two cases of FIGS. 1 and 2, the output signal of the oscillator is sampled on the source at the terminal designated O.

As has been stated hereinbefore, it is still possible to group a plurality of elementary oscillators in order to obtain an oscillator, whose output power on the common terminal O is higher. However, as the dielectric resonators are washers of dielectric materials, whose dielectric constant $\epsilon$ is high, namely equal to or higher than 30 for example, it is difficult, or even impossible to produce such washers having strictly identical characteristics at the frequencies in question, i.e. in the 11 to 14 GHz range. Thus, the addition of several local oscillators, each having its own dielectric resonator makes it possible to increase the output power, but at the expense of a higher background noise.

Figure 3:
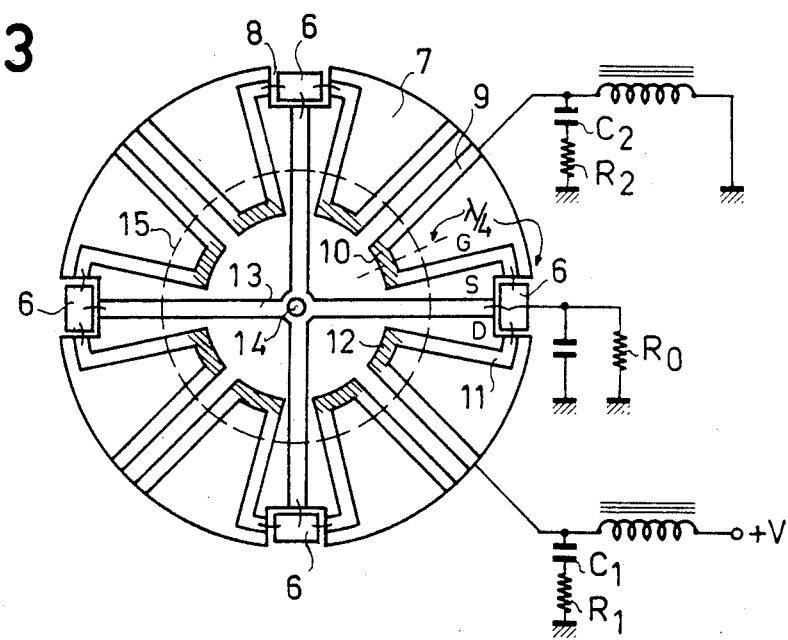
FIG. 3 a plan view of an oscillator according to the invention having a circular configuration.

This is prevented by the low noise power oscillator according to the invention, whose installation diagram is shown in FIG. 3, in a first circular configuration.

FIG. 3 shows a low noise oscillator grouping a plurality of field effect transistors connected in accordance with the circuit diagram of FIG. 2, i.e. both the gate and the drain are joined to microstrip lines. It shows 4 transistors, but neither the accuracy, nor the representation given in any way limit the scope of the invention, which is applicable in general terms to an oscillator having a plurality of transistors.

The transistor chips 6 are grouped around a dielectric substrate 7, e.g. of alumina and which is circular. It is particularly advantageous for the dielectric substrate 7 to have slots 8, in which are placed the field effect transistor chips 6, because this arrangement facilitates the connection between the connectors of said chips and the microstrips, deposited on the upper face of the dielectric substrate. These connections are brought about by thermally welded metal wires.

Frequency-tuned and impedance-matched microstrips are deposited by thin or thick layer methods on the surface of the dielectric substrate 7. If these microstrips are to be coupled to the resonator they are U-shaped and then have two radial sections, as well as a section concentric to the dielectric substrate 7. Thus, three microstrips are produced by each field effect transistor. In this case, microstrip 9 is shown on FIG. 3, joined by a metal wire to the gate of a transistor 6. It is U-shaped and only its central portion 10, concentric to the disk is coupled to the resonator. In the same way, the microstrip 11 is connected by a metal wire to the drain connector of the same transistor 6 and only its central portion 12 is coupled to the resonator. Finally, microstrip 13 joined to the transistor connector is completely radial. Thus, it is not coupled to the resonator and serves as an output by central coaxial cable 14. The dotted line circle 15 indicates the outline of the plane of the dielectric substrate of the dielectric resonator placed on the assembly.

This arrangement is fundamentally based on the fact that portions of radial microstrips and portions of said same microstrips concentric with respect to the dielectric substrate and simultaneously with respect to the dielectric resonator 15, so that only those portions of the lines which are circular, i.e. those described as being concentric relative to the resonator are coupled to the magnetic field of the latter. All the radial portions are not coupled and the propagation is as if the resonator was absent. Thus, the coupling zones are located at appropriate distances relative to the transistors, generally of approximately $\lambda/4$, $\lambda$ being the propagation wavelength on the microstrip line. Thus, the length $\lambda/4$ is that from the connector of a transistor, e.g. the gate, to the center of the line portion coupled to the resonator.

In the representation adopted for FIG. 3, i.e. with the gate and the drain coupled to the same dielectric resonator, the diameter of the dielectric substrate is calculated in such a way that, with the diameter of the dielectric resonator 15 predetermined and the total length $\lambda/2$ of the microstrips being given by the operating frequency, the coupling zones 10 and 12, shown in hatched form, are at a distance from the center which is less than the radius of resonator 15, so that the coupling between the magnetic field of resonator 15 and the coupling zones 10 and 12 of the microstrips is optimized. This detail will be described relative to FIG. 5. Moreover, the resonator is placed under resonance conditions optimizing the efficiency of the oscillator and it functions according to a mode known to the Expert as $TE_{01\delta}$.

Moreover, in the case of the present drawing and which corresponds to FIG. 2, the advantageous solution consisting of supplying the drain with a positive voltage has been adopted, rather than placing the source under a negative voltage. It is known that positive supplies are more readily available than negative supplies. The gate is electrically connected to earth for direct current and the source is self-biased due to resistor R0.

A variant of the oscillator according to the invention makes it easily possible to obtain a diagram in accordance with that of FIG. 1. If, for example, it is not wished that the drain is coupled to a single resonator by a microstrip line, the output line 11 has no radial section and passes directly to the edge of the dielectric substrate for its connection to earth, or in the present case for a supply by positive voltage.

Figure 4:
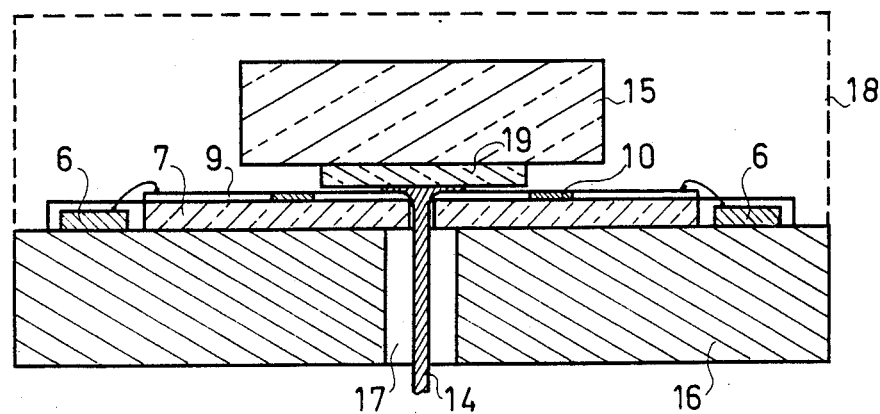
FIG. 4 a sectional view of the oscillator of FIG. 3 according to the invention.

FIG. 4 is a sectional view of the oscillator according to the invention and permits a better understanding of the structure.

This oscillator is produced on a metal base 16, which also serves as an encapsulating box bottom, the latter being closed by a cover indicated by a dotted line 18, the problem of the encapsulation between a box bottom 16 and a cover 18 falling outside the scope of the invention and the Expert will choose a ceramic or a metal encapsulation, according to the particular needs of the case. The bottom of the metal box 16 serves as an earth plane for the encapsulated ultra-high frequency device and in the present case is centrally perforated by an opening 17, through which passes the coaxial output cable 14. On the bottom of said box is arranged the dielectric substrate 7 and, as a function of the chosen sectional plane, it is possible to see two transistor chips 6. The upper face, i.e. the free face of dielectric substrate 7, supports microstrip lines and in particular the gate microstrip line 9 of a transistor 6 and its coupling zone 10. The dielectric resonator 15 is placed over the system of microstrip lines and is centered relative to the substrate and relative to the coaxial output cable. However, it is supported by a shim 19, whose thickness is equal to or less than 0.5 mm and which is formed from a dielectric material with a low coefficient $\epsilon \leq 9$, said shim serving to optimize the coupling and efficiency of the oscillator. For this purpose, its thickness can be regulated, i.e. it is machined or ground until a thickness giving an optimum coupling for the oscillator is obtained.

Figure 5:
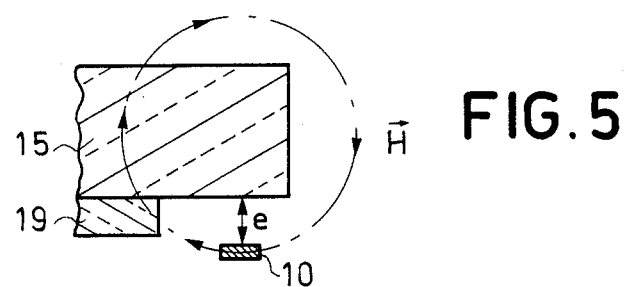
FIG. 5 a detailed view showing the effect of a shim in the oscillator according to the invention.

FIG. 5 is a larger-scale detail of the coupling between a microstrip element 10 and the resonator 15. The magnetic field $\vec{H}$ from the resonator is optimum in the tuned microstrip 10 in the presence of the shim 19, which thus brings about a variation "e" between the lower face of resonator 15 and the upper face of the microstrip line. The low noise oscillator according to the invention would also operate without the shim 19, but it would be less well tuned and optimized.

Figure 6:
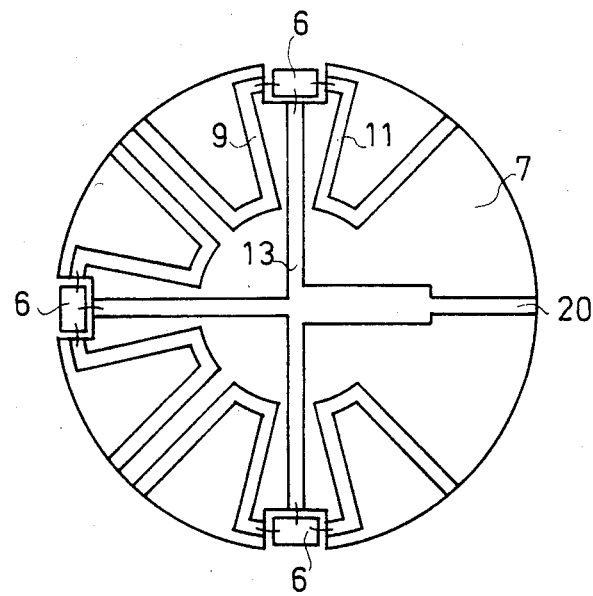
FIG. 6 a variant of the oscillator of FIG. 3, with outputs of the coplanar microstrip type.

FIG. 6 shows a variant of the oscillator according to the invention, as shown in FIG. 3. The oscillator of FIG. 3 has a central output to the box via a coaxial cable. The oscillator of FIG. 6 has a coplanar output, via a microstrip 20 carried by the dielectric substrate 7 in the same plane as the other microstrips of the device.

It is obvious that the representation of FIG. 6 could also be taken directly from that of FIG. 3 by moving together to the greatest possible extent the transistors and their microstrips supported by the dielectric substrate 7 and by passing output line 20 between two gate and drain microstrips of the oscillator transistors.

Figure 7:
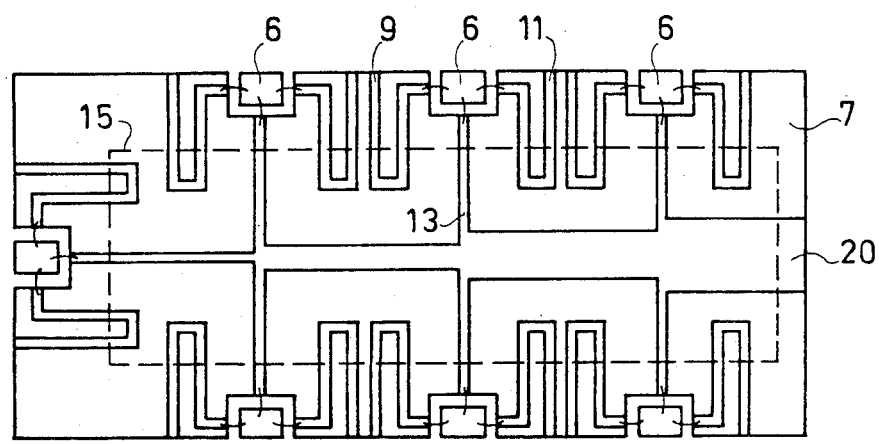
FIG. 7 a plan view of a rectangular oscillator.

FIG. 7 is a plan view of an oscillator according to the invention, in a linear configuration, which is rectangular, but which could equally well be square. The operation of such a device is the same as that described on the basis of a circular configuration but, in certain cases, it may be advantageous to use such a linear configuration, with a rectangular box.

Although in simplified form, FIG. 7 shows that the transistors 6 are grouped around a rectangular substrate 7 in slots 8. The single rectangular dielectric resonator 15 is represented by its dotted outline. The microstrips 9, 11 and 13 are no longer radial or concentric and are instead perpendicular or parallel to the edge of the resonator. A coplanar microstrip output 20 is shown in FIG. 7, but a central output by coaxial cables also falls within the scope of the invention.

The rectangular structure of FIG. 7 is particularly suitable for the integration of the oscillator on a monolithic wafer, the insulating substrate then being a semiconductor material wafer made insulating by doping.

In this case, apart from its box, the oscillator comprises a single resonator and an insulating monolithic wafer, on whose periphery the transistors are produced by known methods, such as diffusion, implantation, etc. and on whose surface are deposited the matched microstrip lines. In this case, the output is preferably constituted by coplanar microstrips.

Such a monolithic arrangement is of interest at high frequencies of about 30 GHz, because the dimensions of the microstrip lines are then such that they make the device compatible with the cutting of a wafer with a side length of a few millimeters, e.g. 2 mm. At these frequencies, the association of several field effect transistors is justified to an increasing extent as their power drops. For example, an oscillator according to the invention supplies 100 milliwatts at 11 GHz.

In addition, the changing of the transistor type or the adapting of the materials as described in the present text, forms part of the scope of the invention, which essentially consists of coupling a plurality of transistors on a single dielectric resonator, and as defined in the following claims.

What is claimed is:

1. A low noise oscillator, operating in the ultra-high frequency range, comprising a plurality of transistors stabilized by a dielectric resonator coupled to a tuned microstrip line, wherein the plurality of transistors is grouped on the periphery of an insulating substrate plate, which supports said dielectric resonator, centered on the insulating substrate and of smaller size than the latter, and wherein each transistor is connected to at least one microstrip line supported by the substrate, said line having a broken U-configuration, such that the two end portions of the microstrip line are parallel to the field lines of the resonator and the central portion, covered by the resonator and perpendicular to its field lines, is coupled to said resonator.

2. A low noise oscillator according to claim 1, wherein the transistors are field effect transistors stabilized on their gate electrode by a microstrip line, coupled to the single resonator.

3. A low noise oscillator according to claim 2, wherein the transistors are also stabilized on their drain electrode by a microstrip line coupled to the single resonator.

4. A low noise oscillator according to claim 1, wherein, as the substrate is circular, the resonator is also circular, the end portion of the microstrip lines being radial and the portions of the lines coupled to the single resonator are arranged in the form of a circle whose diameter is smaller than the resonator diameter.

5. A low noise oscillator according to claim 1, wherein, as the insulating substrate is rectangular, the resonator is also rectangular, the end portions of the microstrip lines being perpendicular to the edges of the substrates and the portions of the lines coupled to the single resonator are parallel to the edges of the substrate and the resonator.

6. A low noise oscillator according to claim 1, wherein, as the insulating substrate is planar, it has on its periphery slots in which are positioned the transistor chips, and wherein the microstrip lines, starting from the edges of these slots, are coplanar to the transistors.

7. A low noise oscillator according to claim 6, wherein the output signal of the oscillator, sampled at the source of each of the transistors by means of a line, is supplied to the center of the substrate by a coaxial cable, perpendicular to the plane of the substrate.

8. A low noise oscillator according to claim 6, wherein the output signal of the oscillator, sampled at the source of each of the transistors by means of a line, is supplied to the edge of the substrate by an impedance-matched line which is coplanar to the plane of the substrate and the microstrip lines.

9. A low noise oscillator according to any one of the claims 1 to 8, wherein a dielectric material support having a low constant ($\epsilon \leq 9$) with a regulatable thickness, is placed between the resonator and the coupled portions of the lines, in order to optimize the line/- resonator coupling and improving the efficiency of the oscillator.

10. A low noise oscillator according to claim 1, wherein the transistors, the microstrip lines and the insulating substrate are monolithic, the transistors being produced in a wafer of semiconductor material made insulating by doping, and the microstrip lines are deposited on said wafer.

11. A low noise oscillator according to claim 1, wherein it is mounted in an encapsulating box, whose metal bottom serves as n earth plane for the microstrip lines.

* * * * *